US009741419B1

(12) United States Patent
Reohr et al.

(10) Patent No.: US 9,741,419 B1
(45) Date of Patent: Aug. 22, 2017

(54) MEMORY SYSTEM WITH A CONTENT ADDRESSABLE SUPERCONDUCTING MEMORY

(71) Applicant: Microsoft Technology Licensing, LLC, Redmond, WA (US)

(72) Inventors: William R Reohr, Severna Park, MD (US); Brian R Konigsburg, Glen Burnie, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/437,379

(22) Filed: Feb. 20, 2017

Related U.S. Application Data

(63) Continuation of application No. 15/135,635, filed on Apr. 22, 2016, now Pat. No. 9,613,699.

(51) Int. Cl.
G11C 11/44 (2006.01)
G11C 11/16 (2006.01)
G11C 15/02 (2006.01)

(52) U.S. Cl.
CPC ...... G11C 11/1675 (2013.01); G11C 11/1673 (2013.01); G11C 15/02 (2013.01)

(58) Field of Classification Search
USPC ........................................ 365/160, 162, 171
See application file for complete search history.

(56) References Cited

U.S. PATENT DOCUMENTS

| 4,601,015 A | 7/1986 | Ishida |
| 4,974,205 A | 11/1990 | Kotani |
| 5,276,639 A | 1/1994 | Inoue |
| 5,323,344 A | 6/1994 | Katayama et al. |
| 5,365,476 A | 11/1994 | Mukhanov |
| 5,629,889 A | 5/1997 | Chandra et al. |
| 6,326,807 B1 | 12/2001 | Veenstra et al. |
| 6,816,431 B1 | 11/2004 | Lu et al. |
| 7,253,654 B2 * | 8/2007 | Amin .................... B82Y 10/00 326/3 |
| 8,270,209 B2 | 9/2012 | Herr et al. |

(Continued)

OTHER PUBLICATIONS

Morisue, et al., "A Content Addressable Memory Using Josephson Junctions", In Proceedings of IEEE Transactions on Applied Superconductivity, vol. 1, Issue 1, Mar. 1991, pp. 48-53.

(Continued)

*Primary Examiner* — Vu Le
(74) *Attorney, Agent, or Firm* — Singh Law, PLLC; Ranjeev Singh

(57) ABSTRACT

A memory system including a content addressable memory having an array of content addressable memory elements including a plurality of rows of content addressable memory elements and a plurality of columns of content addressable memory elements is provided. Each of the content addressable memory elements further includes a first superconducting quantum interference device (SQUID) and a second superconducting quantum interference device (SQUID), where an input bit to each of the content addressable memory elements is compared with: (1) a first state of the first SQUID and (2) a second state of the second SQUID to generate an output signal. The memory system further includes a Josephson magnetic random access memory (JMRAM), coupled to the content addressable memory.

20 Claims, 9 Drawing Sheets

(56) References Cited

U.S. PATENT DOCUMENTS

| | | |
|---|---|---|
| 8,780,616 B2 | 7/2014 | Ohki et al. |
| 9,013,916 B2 | 4/2015 | Naaman et al. |
| 2011/0267878 A1* | 11/2011 | Herr .................. G11C 11/44 365/171 |
| 2012/0184445 A1* | 7/2012 | Mukhanov .............. G11C 11/44 505/171 |
| 2012/0324204 A1 | 12/2012 | Inoue |

OTHER PUBLICATIONS

Vernik, et al., "Magnetic Josephson Junctions with Superconducting Interlayer for Cryogenic Memory", In Proceedings of IEEE Transactions on Applied Superconductivity, vol. 23, Issue 3, Dec. 10, 2012, pp. 1-8.

Josephson, Brian, "Josephson Effect", Retrieved on: Jan. 13, 2016 Available at: http://www.supraconductivite.fr/en/index.php?p=applications-squid-josephson.

Goldobin, et al., "Memory cell based on a φ Josephson junction", In Journal of Applied Physics Letters, vol. 102, Issue 24, Jun. 20, 2013, 5 pages.

* cited by examiner

MEMORY SYSTEM WITH A CONTENT ADDRESSABLE SUPERCONDUCTING MEMORY

This application claims the benefit of priority under 35 U.S.C. §120 to U.S. patent application Ser. No. 15/135,635, entitled "Memory System with a Content Addressable Superconducting Memory," filed on Apr. 22, 2016, the disclosure of which is incorporated herein in its entirety by reference.

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition power consumption at high clock speeds by digital circuits, based on the CMOS technology, has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based devices, including content addressable superconducting memories.

SUMMARY

In one example, the present disclosure relates to a memory system comprising a content addressable memory having an array of content addressable memory elements including a plurality of rows of content addressable memory elements and a plurality of columns of content addressable memory elements. Each of the content addressable memory elements may further include a first superconducting quantum interference device (SQUID) and a second superconducting quantum interference device (SQUID), where an input bit to each of the content addressable memory elements is compared with: (1) a first state of the first SQUID and (2) a second state of the second SQUID to generate an output signal.

In another aspect, the present disclosure relates to a memory system including a content addressable memory and a Josephson magnetic random access memory (JMRAM). The content addressable memory may include an array of content addressable memory elements. Each of the content addressable elements may further include a first superconducting quantum interference device (SQUID) and a second superconducting quantum interference device (SQUID), where an input bit to each of the content addressable memory elements is compared with: (1) a first state of the first SQUID and (2) a second state of the second SQUID to generate an output signal. The JMRAM may be coupled to the content addressable memory and the JMRAM may include a plurality of word lines, where the output signal may be configured to activate, without requiring decoding, one of the plurality of the word lines.

In yet another aspect, the present disclosure relates to a memory system including a content addressable memory system and a Josephson magnetic random access memory (JMRAM). The content addressable memory may include a plurality of rows of content addressable memory elements and a plurality of columns of content addressable memory elements, where each of the plurality of rows of the content addressable elements may correspond to stored bits of a respective content addressable memory entry, where a row hit for an input address may relate to a match between each of the input bits of the input address and each of the stored bits of the respective content addressable memory entry, and where a row hit signal may be generated based on the row hit. The JMRAM may be coupled to the content addressable memory and the JMRAM may include a plurality of word lines, where the row hit signal may be configured to activate, without requiring decoding, one of the plurality of word lines.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
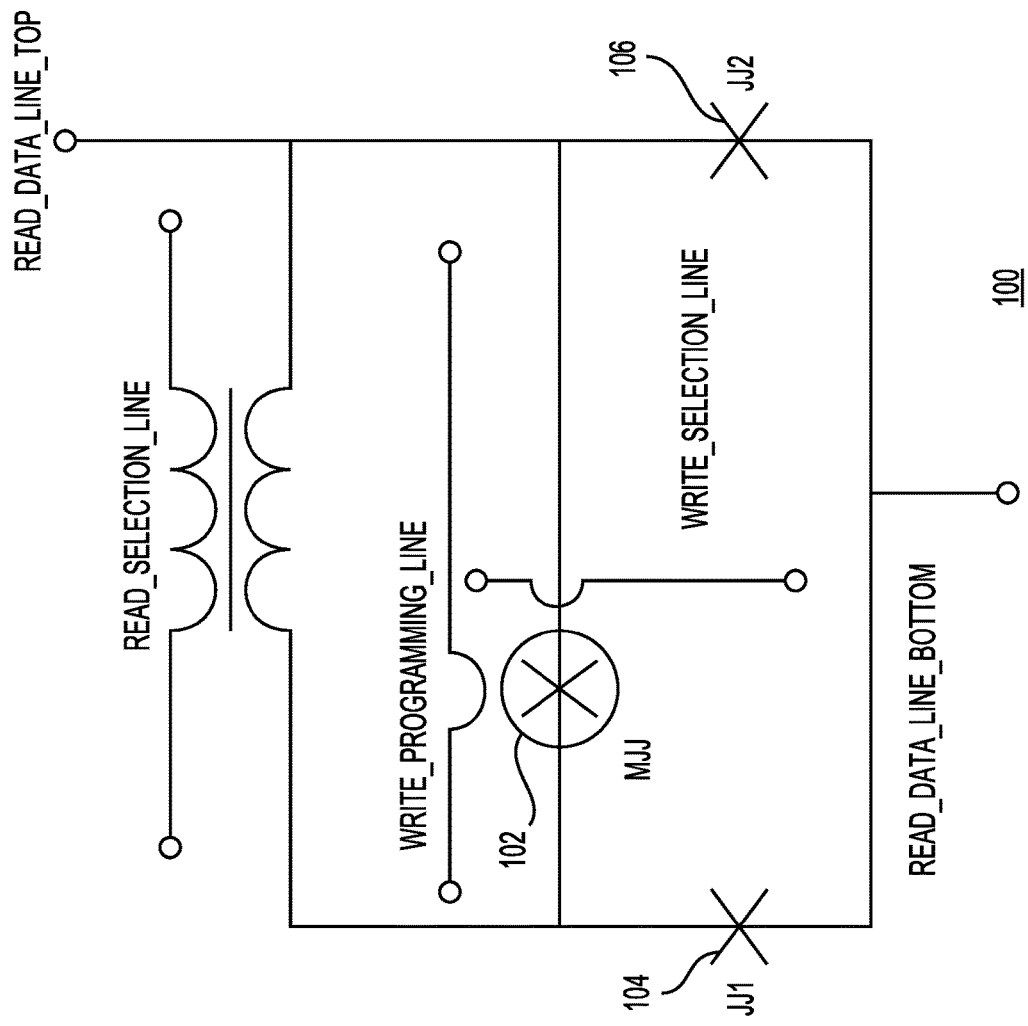
FIG. 1 shows a Josephson magnetic random access memory (JMRAM) cell in accordance with one example.

Examples described in this disclosure relate to content addressable superconducting memories and memory systems based on content addressable superconducting memories. Certain examples further relate to superconducting circuits based memories. Unlike CMOS transistors, the superconducting circuits use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the superconducting circuits. As an example, superconductors are materials that can carry a direct electrical current (DC) in the absence of an electric field. Such materials have almost zero resistance, like exemplary superconductor Niobium, which has a critical temperature (Tc) of 9.3 Kelvin. At temperatures below Tc, Niobium is superconductive; however, at temperatures above Tc it behaves as a normal metal with electrical resistance. Thus, in the SIS type of Josephson junctions, superconductors may be Niobium superconductors and insulators may be Aluminum Oxide barriers. In superconducting circuits, in one example, the SIS type of junction may be part of a superconducting loop. The time integral of the potential difference between the two superconductors corresponds to a change in the magnetic flux through the loop by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In superconducting circuits, each Josephson junction may be part of one or more superconducting loops.

Various superconducting circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The superconducting circuits may advantageously have zero static power dissipation because of the absence of bias resistors. In addition, the superconducting circuits may be powered using alternating current (AC) power thereby eliminating the ground return current. The AC power supply may also act as a stable clock reference signal for the superconducting circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary superconducting logic circuits may include various types of logic gates. Exemplary logic gates, include an AND gate, an OR gate, a logical A-and-not-B (AanB) gate and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B goes to output Q1 and the second input pulse goes to output Q2. The logical behavior of these gates is based on the reciprocal data encoding mentioned earlier. As an example, a positive pulse changes the internal flux state of the inductive loop, but the trailing negative pulse erases the internal state every clock cycle, which in turn produces combinational logic behavior.

In general, using superconducting technology, content addressable memories (CAMs) can efficiently realize content addressable memory (CAM) functions. CAMs may perform high speed searches of entries within a memory. Unlike traditional RAMs, the entire memory of a CAM may be searched, within a single access, for a match to a particular data word, or what may be referred to as a CAM entry. In a CAM, any entry could be located anywhere within the CAM. Address translations (e.g. for virtualized addressing schemes), searches, network traversals, and data associations may advantageously be made fast, area efficient, and low power by using CAMs.

In certain examples, CAMs may be formed using Josephson Magnetic Random Access Memories (JMRAM) circuits and superconducting logic circuits, including, for example, reciprocal quantum logic (RQL) circuits. In one example, a CAM cell may include two JMRAM cells. Other than the two cells, it may not require additional devices to implement a bitwise comparator (XOR) function, as a CAM cell would require in CMOS-based implementation.

In general, signals (e.g., SFQ pulses) may be used to control the state of a memory cell. During read/write operations, word-lines and bit-lines may be selectively activated by SFQ pulses arriving via an address bus. These pulses may, in turn, control word-line and bit-line drivers that may provide word-line and bit-line currents to the relevant memory cells. As an example, such a memory cell may be read out using a superconducting quantum interference device (SQUID). The memory cell may include a SQUID and a magnetic Josephson junction (MJJ) device, which may be configured such that under the application of appropriate amounts of current bias and magnetic flux, the memory cell may be in a logic '1' state or in a logic '0' state.

FIG. 1 shows a JMRAM cell 100 in accordance with one example. JMRAM cell 100 may include a magnetic Josephson junction (MJJ) 102, Josephson junction (JJ1) 104, and another Josephson junction (JJ2) 106. JJ1 104 and JJ2 106 may be formed using superconductor-insulator-superconductor (SIS) type of Josephson junction. MJJ 102 may be formed using a superconductor with at least two magnetic barrier layers (e.g., ferromagnetic barriers) that are compatible with SQUID-based circuits. In one example, MJJ 102 could have two magnetic barrier layers, with one of them having a fixed magnetic moment and the other one of them having a variable magnetic moment. The variable moment may be set either to a point in parallel with respect to the fixed magnetic moment, in which case the MJJ is set to the "π" state or to a point that is anti-parallel (opposite direction) with respect to the fixed magnetic moment, in which case the MJJ is set to the "0" state.

The example JMRAM cell 100 may be used as part of an array in which such cells are disposed in rows and columns. In one example, READ_SELECTION_LINES (RSLs) may run in a parallel direction to the WRITE_PROGRAMMING_LINES (WPLs) and the WRITE_SELECTION_LINES (WSLs) may run in a parallel direction to READ_DATA_LINES (RDLs). RSLs may provide the functionality of read word lines and RDLs may provide the functionality of read bit lines. WPLs may provide the functionality of write bit lines and WSLs may provide the functionality of write word lines. In this way, the JMRAM cells arranged along the READ_DATA_LINES may be programmed all at once by WPLs. In one example, JMRAM cells connected in this manner may be referred to as orthogonal JMRAM cells (CellOrth).

With continued reference to FIG. 1, a DC bias current may pass through the READ_DATA_LINE_TOP (RDLT) and through the SQUID and out to the READ_DATA_LINE_BOTTOM (RDLB). In one example, the critical current of the SQUID may be at its maximum value when the magnetic junction is in the 0 state (e.g., no phase added to the superconducting loop) and the RSL is "off." The critical current of the SQUID may be at its minimum value when the magnetic junction is in the π state and the RSL is on. As an example, for a read operation a selected RSL driver generates a pulse that propagates along the selected RSL. As the pulse travels along the RSL, passing through the transformers of each of the memory cells along the RSL, it couples a 90 degree phase shift into the SQUIDs of each of the memory cells. Memory cells in the "π" state—or "1" state—shift the SQUID phase by another 90 degrees for a total of 180 degrees phase shift. In other words, the critical current of the SQUID is at its minimum when the magnetic junction is in the "π" state and there is a current pulse traversing the RSL. Such a phase shift (or minimum critical current) may cause a DC-biased SQUID to emit voltage pulses that move up and down a transmission line—for example, the READ_DATA_LINE_TOP (RDLT) (which is formed from series-connected memory cells). Eventually at least one of the pulses reaches a sense circuit where it is detected and resynchronized with the resonator clock. Thus, in one example, the sense circuit generates the requisite initial and reciprocal SFQ pulses necessary for driving the superconductor logic, e.g., the RQL logic that interfaces with the memory.

As an example, for a write operation, one WSL driver and all WRITE_PROGRAMMING_LINE (WPL) drivers source write currents through one selected WSL and all of the selected WPLs in the memory array. As shown in FIG. 1, the WPL intersects the RDL at a 90 degree angle or an orthogonal angle. The currents sent through the WSL and the WPLs at similar times generate the coincident and orthogonal magnetic fields that may change the MJJs (e.g., MJJ 102) within each of the memory cells to a new state. The field created by the WSL drives all MJJs of the memory cells along the WSL into an active write state. In one example, all of these MJJs must be driven, by either positive or negative WPL fields, to either 7 or 0 states, which may respectively alter the data to a logical 1 or 0. Although FIG. 1 shows a certain number of components of JMRAM cell 100 arranged in a certain manner, there could be more or fewer number of components arranged differently.

Figure 2:
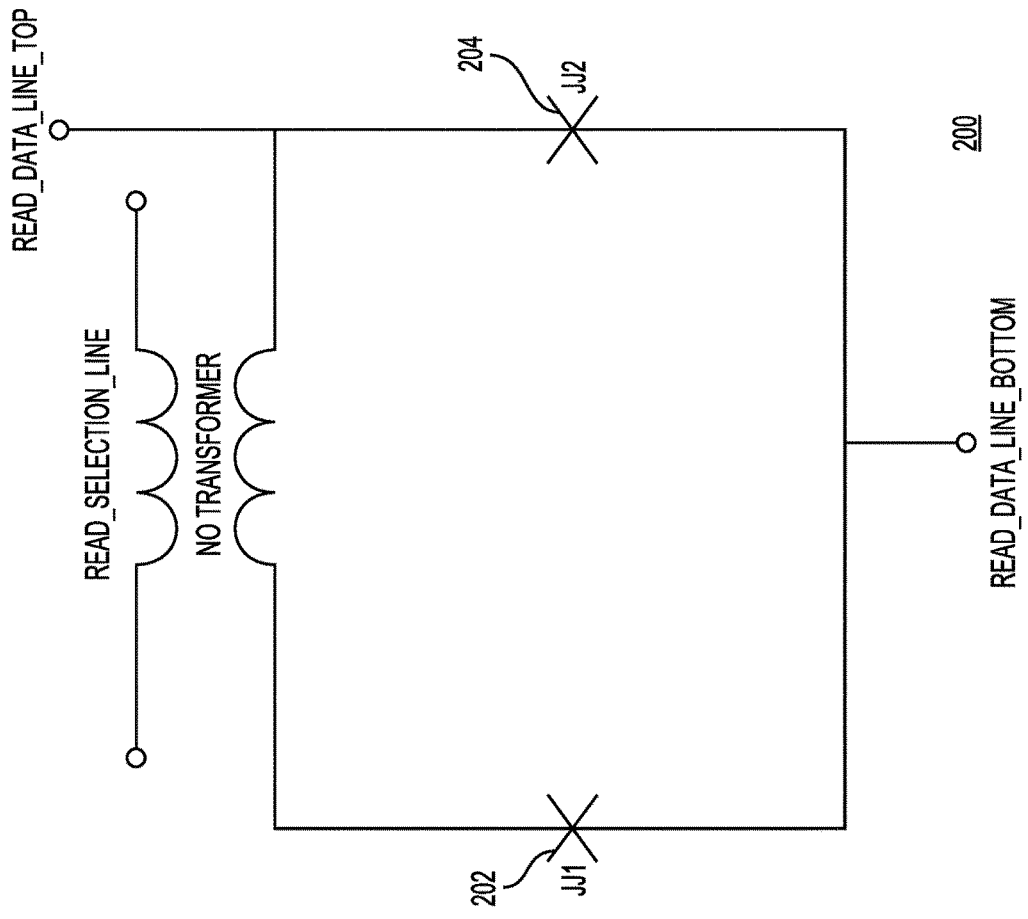
FIG. 2 shows a diagram of a Cell-No-Connect (CellNoCon) element in accordance with one example.

FIG. 2 shows a diagram of a Cell-No-Connect (CellNoCon) element 200 in accordance with one example. Cell-NoCon element 200 creates an electrically continuous conduction path for forwarding charge (e.g., Cooper pairs) along the READ_DATA_LINES. As shown in FIG. 2, the lack of a transformer in CellNoCon element 200 prevents an inductive coupling from a READ_SELECTION_LINE with a SQUID. Although FIG. 2 shows a certain number of components of CellNoCon 200 arranged in a certain manner, there could be more or fewer components arranged differently.

Figure 3:
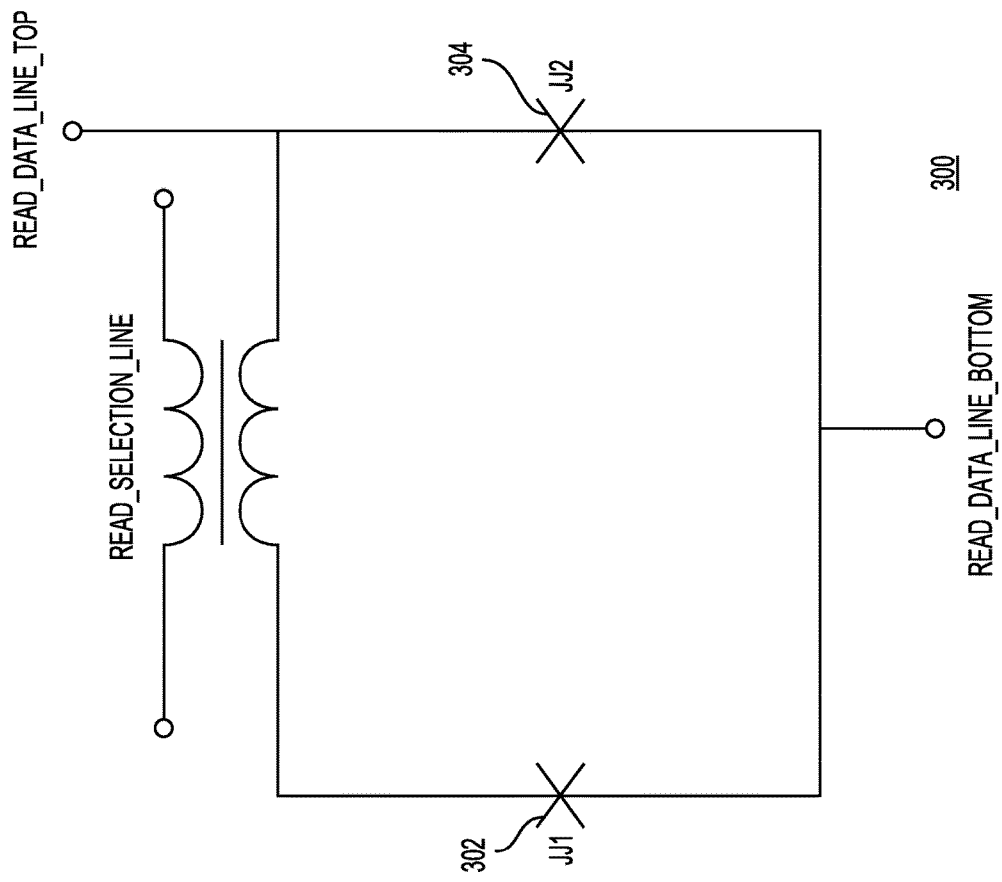
FIG. 3 shows a diagram of a Cell-Connect (CellCon) element in accordance with one example.

FIG. 3 shows a diagram of a Cell-Connect (CellCon) element 300 in accordance with one example. CellCon element 300 creates an electrically continuous conduction path for forwarding charge (e.g., Cooper pairs) along the READ_DATA_LINES. As shown in FIG. 3, the transformer in CellCon element 300 creates an inductive connection between a READ_SELECTION_LINE and a SQUID. Thus, in the examples related to CellNoCon 200 and CellCon 300, a connection relates to an inductive signal connection made between a READ_SELECTION_LINE and a SQUID. Although FIG. 3 shows a certain number of components of CellCon 300 arranged in a certain manner, there could be more or fewer components arranged differently.

Figure 4:
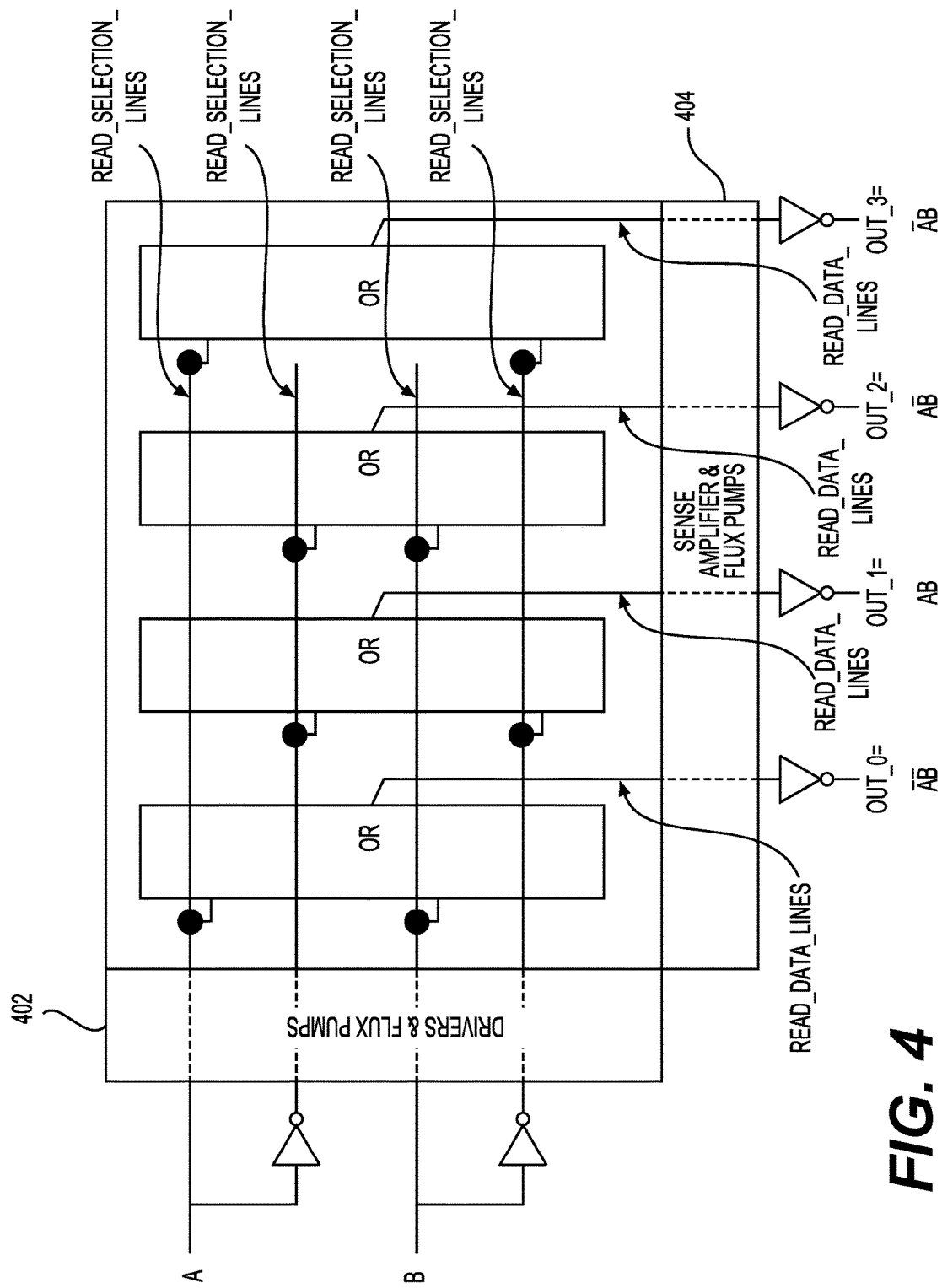
FIGS. 4-7 show diagrams of how match states may be altered through a sequence of write operations to an array of content addressable memory cells, in accordance with various examples.

FIG. 4 shows a diagram of the OR-operation using CellOrth elements described earlier. FIGS. 4 to 7 are used to illustrate how match states may be altered through a sequence of three write operations to an array of CellOrth elements. In each of FIGS. 4 to 7, the presence or the absence of a black dot represents the written state of the elements.

Figure 5:
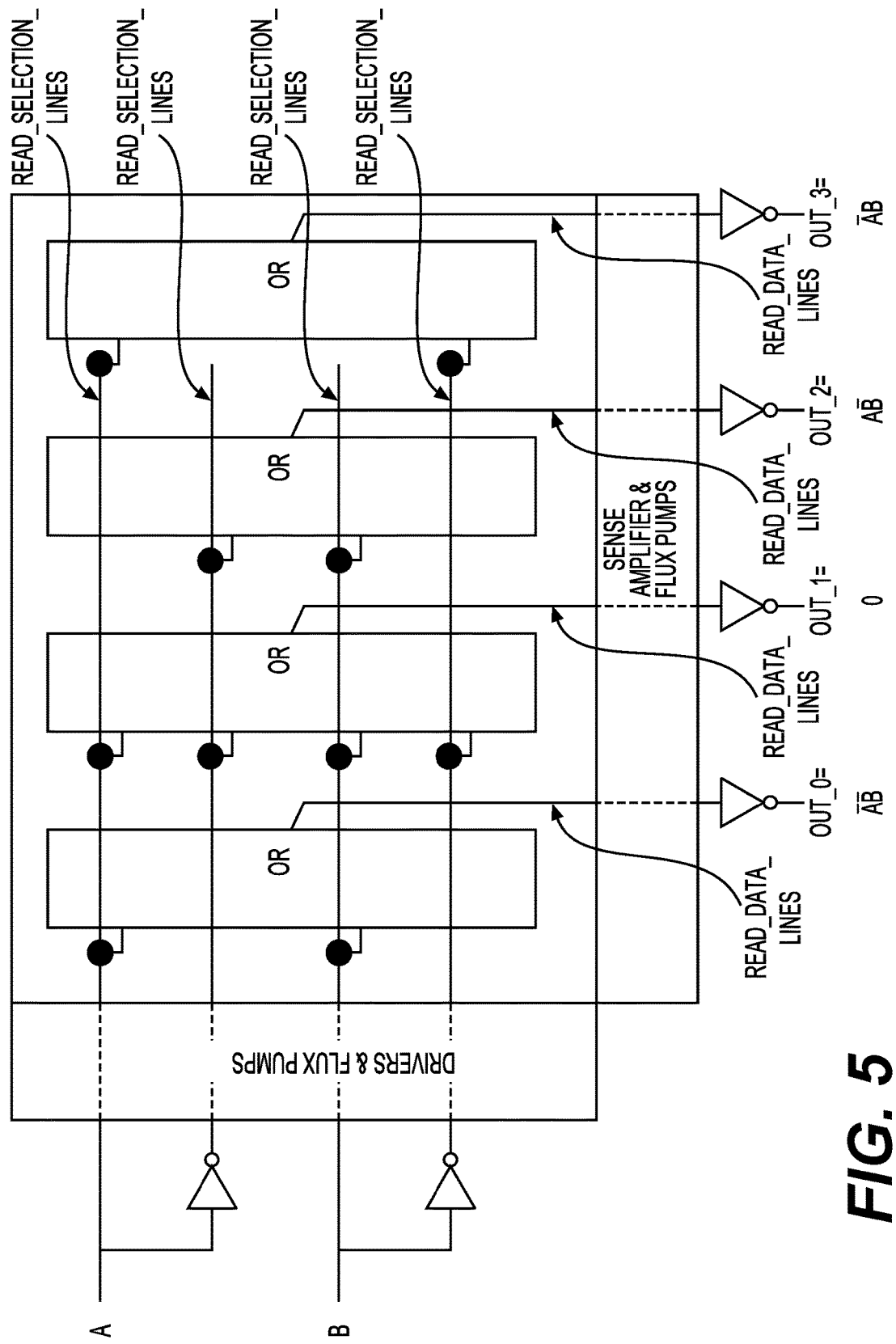
Figure 6:
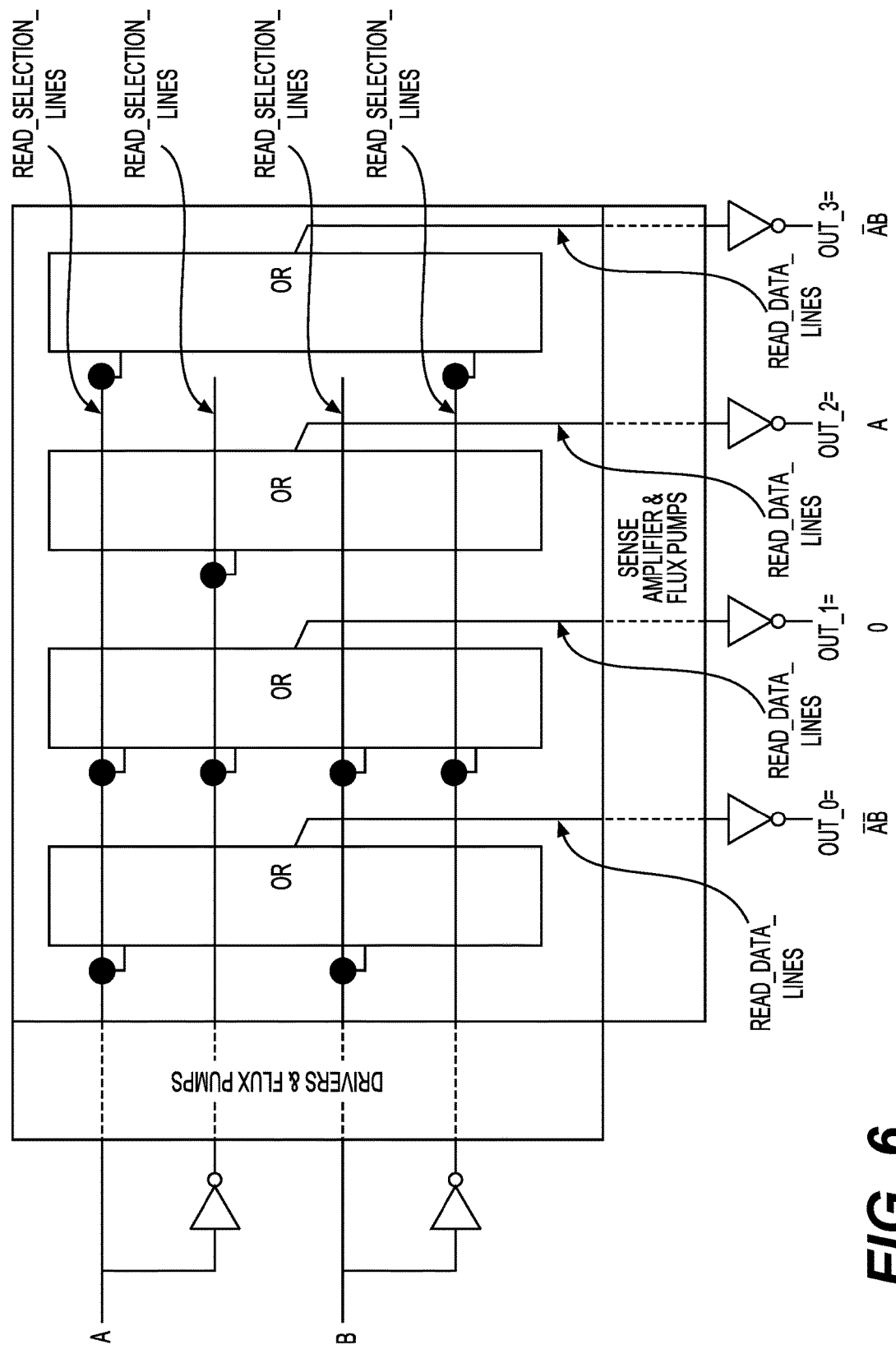
Figure 7:
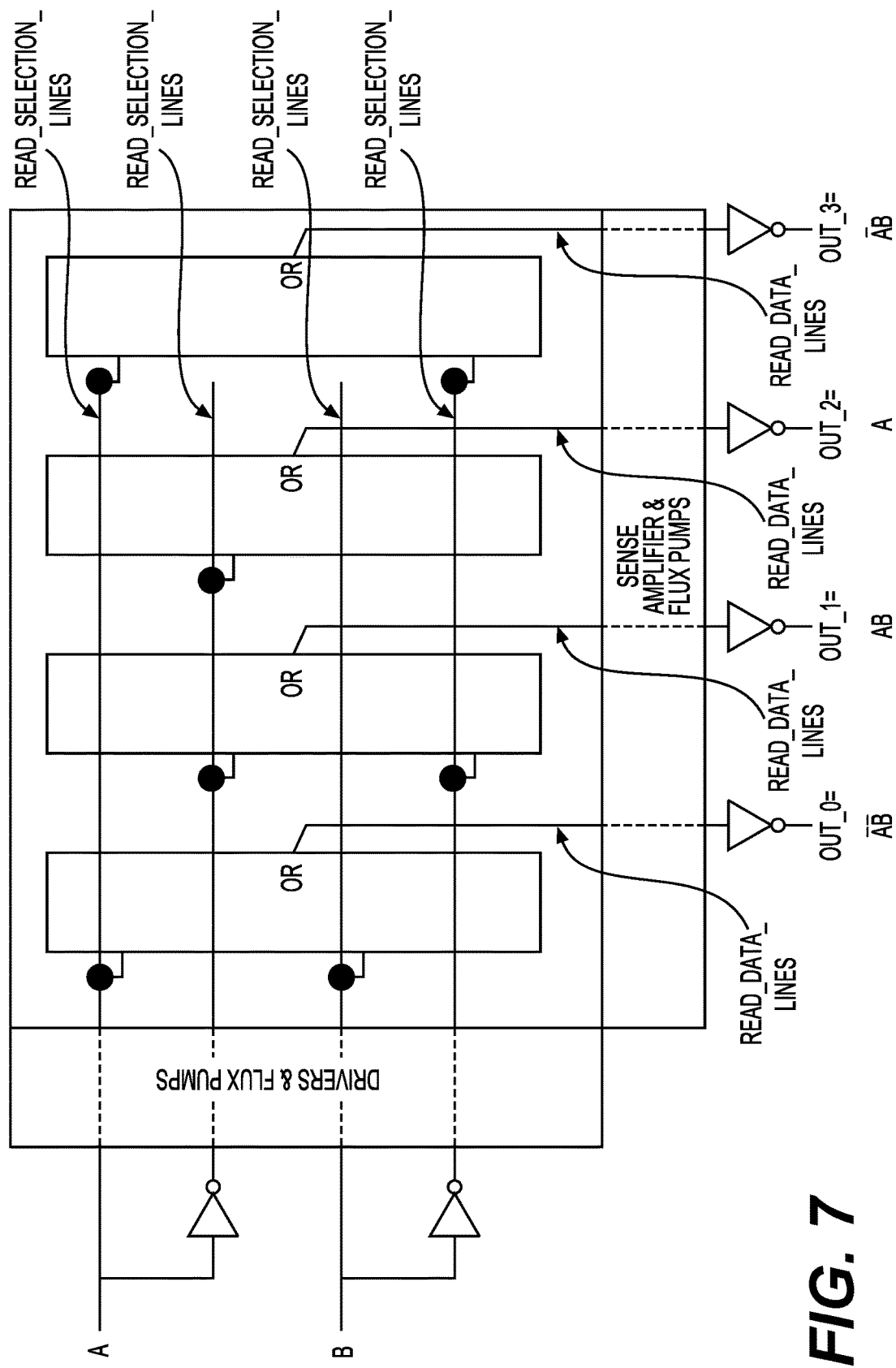

The JMRAM cells, e.g., CellOrths, are organized in an array of rows and columns. FIG. 4 shows only a portion of such an array. An OR connection may be realized at each intersection of the READ_DATA_LINES and the READ_SELECTION_LINES. In this example, the CellOrth elements along the READ_DATA_LINES (which may correspond to read bit lines) represent content addressable memory (CAM) entries. Drivers and Flux Pumps 402 may be used to drive the READ_SELECTION_LINES. Sense Amplifiers and Flux Pumps 404 may be used to sense the output (e.g., Out_0, Out_1, Out_2, or Out_3) on READ_DATA_LINES. An OR connection may span the entire length of a READ_DATA_LINE. Two inputs (A and B) may be provided via respective READ_SELECTION_LINES. Each OR input connection may be enabled any number of times within the array of cells by writing the CellOrth to a "π" state at the intersection of a specified READ_SELECTION_LINE and a specified READ_DATA_LINE. Otherwise, if no OR input is desired, the absence of an OR input connection may be enabled any number of times within the array of cells by writing CellOrth to a "0" state at the intersection of a specified READ_SELECTION_LINE and a specified READ_DATA_LINE. In this example, an output of "1" on any of the outputs, Out_0, Out_1, Out_2, and Out_3, indicates a match between the inputs and the entries/state of the memory cells. As an example, FIG. 4 illustrates previously programmed match states that represent a superconducting content addressable memory (CAM) in a state before the write operations. In one example, new states must be programmed along the OR-dimension and thus cells are programmed along the READ_DATA_LINES. The cells on the same READ_DATA_LINE form a CAM entry. As an example, FIG. 5 shows how an entry is invalidated through a write operation. In this example, no match can be made to the second OR entry. Output Out_1 remains "0," or invalid, no matter the combination of inputs. As an example, FIG. 6 depicts how to write a broader match entry/state to the memory cells. Since the match state does not contain input B, input B is "wild." Its Boolean state has no impact on the output Out_2. As an example, FIG. 7 shows that, with another Match Entry update, writing output Out_1 so that it equals the product of input A and input B, a multiple match condition can be enabled. If inputs A and B each are both set to "1," outputs Out_1 and Out_2 both respond with matches; in other words, with "1s."

Figure 8:
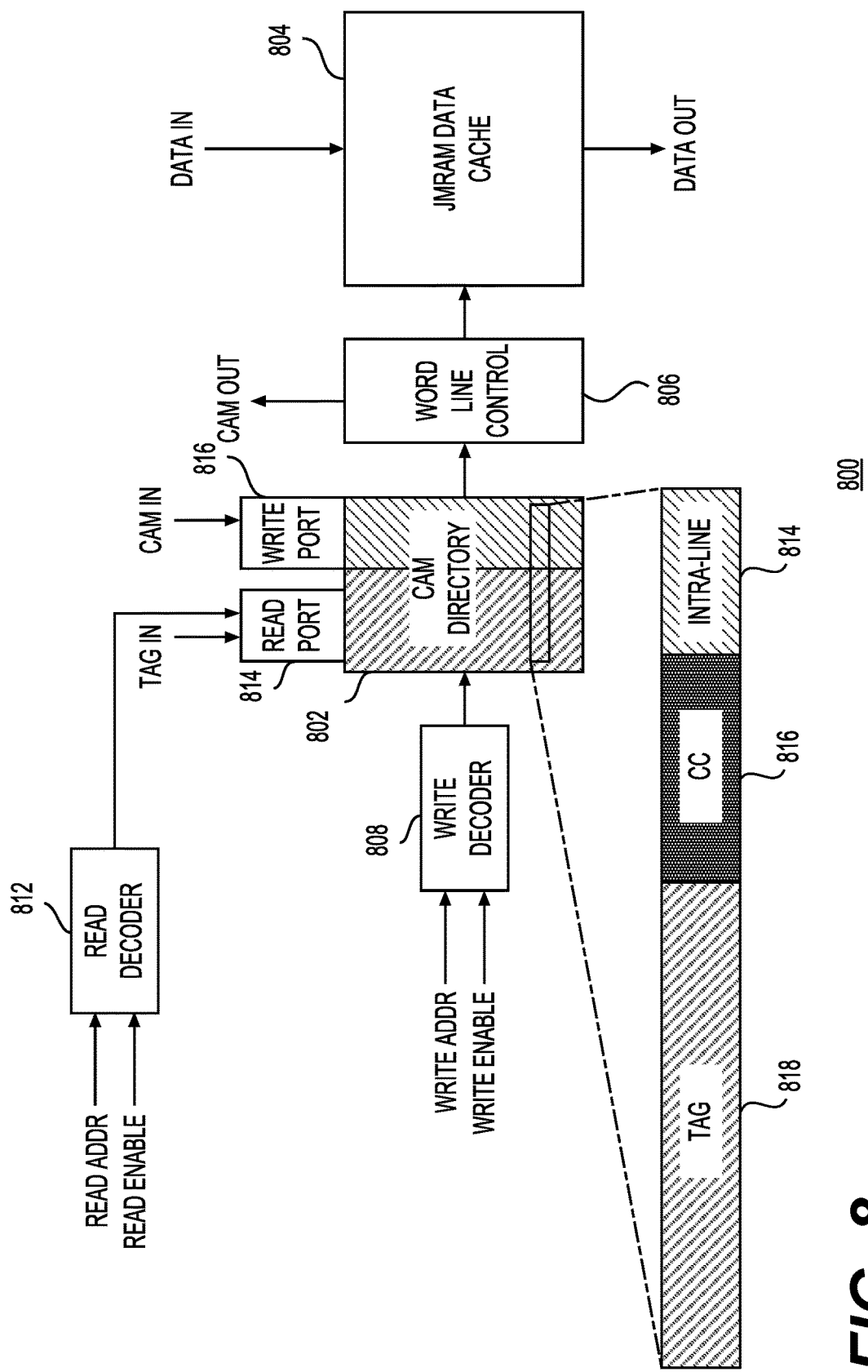
FIG. 8 shows a memory system, including a CAM, in accordance with one example.

FIG. 8 shows a cache memory system 800 using a CAM for the directory. Cache memory system 800 may include CAM Directory 802, JMRAM Data Cache 804, Word Line Control 806, Write Decoder 808, Read Decoder 812, Read Port 814, and Write Port 816. In one example, JMRAM Data Cache 804 may include a plurality of cache data lines for storing data along a row. In an example, TagIn would be the address evaluated against existing entries in CAM Directory 802 for a match. The path that includes TagIn may be activated during a search of CAM Directory 802. If a match exists, CAM Directory 802 may generate a hit (a row activation) on a corresponding row in JMRAM Data Cache 804. In one example, the CamIn input may be used to update an entry in CAM Directory 802 with a new address (e.g., by writing the new address to that entry in CAM Directory 802 via WRITE_PROGRAMMING_LINES). Such an update may occur when replacing a row in JMRAM Data Cache 804 due to a miss in CAM Directory 802. In one example, write decoder 808 may select the actual CAM entry to be updated with the new address. In other words, the write decoder input is used to provide a WRITE_SELECTION_LINE address for writes to CAM Directory 802 when replacing the specified CAM entry due to a CAM miss.

As shown in FIG. 8, the output of CAM Directory 802 is used to control indirectly the word lines for JMRAM Data Cache 804. Hits pass through Word Line Control 806 on their way to JMRAM Data Cache 804. As soon as there is a hit in CAM Directory 802, the hit causes a row hit signal to be generated and that may be used to activate the corresponding word line for JMRAM Data Cache 804. In a system mode, Word Line Control 806 may directly forward the output of CAM Directory 802 to JMRAM Data Cache 804. If one of the outputs of CAM Directory 802 is high, then a "matching" row within JMRAM Data Cache 804 is driven high, and then the data corresponding to the row is driven out via Data Out port of JMRAM Data Cache 804. If there was no SFQ pulse generated on any of the outputs of CAM Directory 802 that would mean there was miss. This way hit/miss determination can be made relatively quickly. The congruence class (CC) 816 and the intra-line 824 sections of CAM Directory 802 may include both CellCon and CellNoCon cells to implement logic associated with CAM Directory 802. This logic may select which portion of a line in CAM Directory 802 will be selected for transfer to JMRAM Data Cache 804. The non-shaded area of CAM Directory 802, which relates to the memory locations, may be implemented using memory cells, e.g., JMRAM cell 100. Although FIG. 8 shows a certain number of components of cache memory system 800 arranged in a certain manner, there could be more or fewer components arranged differently. In addition, although FIG. 8 refers to a data cache, JMRAM Data Cache 804 could include instructions, data, or other types of content as well.

With continued reference to FIG. 8, in one example, read decoder 812 may be used for reading the contents of CAM Directory 802 under debug control. Read decoder 812 may produce only one output that activates only one READ_SELECTION_LINE at a time. Thus, in this example, only one cell on a READ_DATA_LINE is activated at a time. Rather than accessing multiple cells on a wide-OR line in a system mode, individual cells can be accessed to perform test procedures in a debug mode.

In a system mode, in one example, the Word Line Control 806 is the logic that receives the row hit output of CAM Directory 802 and manipulates it, as appropriate, to activate the read/write word lines of JMRAM Data Cache 804. In the debug mode, Word Line Control 806 may be used to gather the individual cell data from all outputs of CAM Directory 802 into a register that can be uploaded (e.g., scanned out) via the CAMOut (debug) port. As explained earlier, in one example, individual cell data may be generated by activating a single READ_DATA_LINE at a time, via read decoder 812.

While CAM Directory 802 is suitable for a fully associative cache directory, it could also be configured as a set associative directory by selecting a replacement algorithm that forces selection of rows based on bits from the tag portion of the cache miss address. As an example, as shown in FIG. 8, the tag bits of the memory address could be partitioned into two fields: Tag 818 and Congruence Class (CC) 816. The CC field 816 may represent the CAM rows that the miss address can replace. One method may be to select the least significant bits of the tag to represent the CC field 816 and use these bits in the replacement algorithm as the most significant bits of the eligible rows of CAM Directory 802 for replacement. In this example, by storing the Tag field 818 and CC field 816 in CAM Directory 802 and restricting replacement to a subset of rows, CAM Directory 802 may behave as a set associative cache. Alternatively, the CAM bits on each row of CAM Directory 802 could be hard coded using CellCon and CellNoCon cells to force rows to only compare when the CC field matches the specified value.

Figure 9:
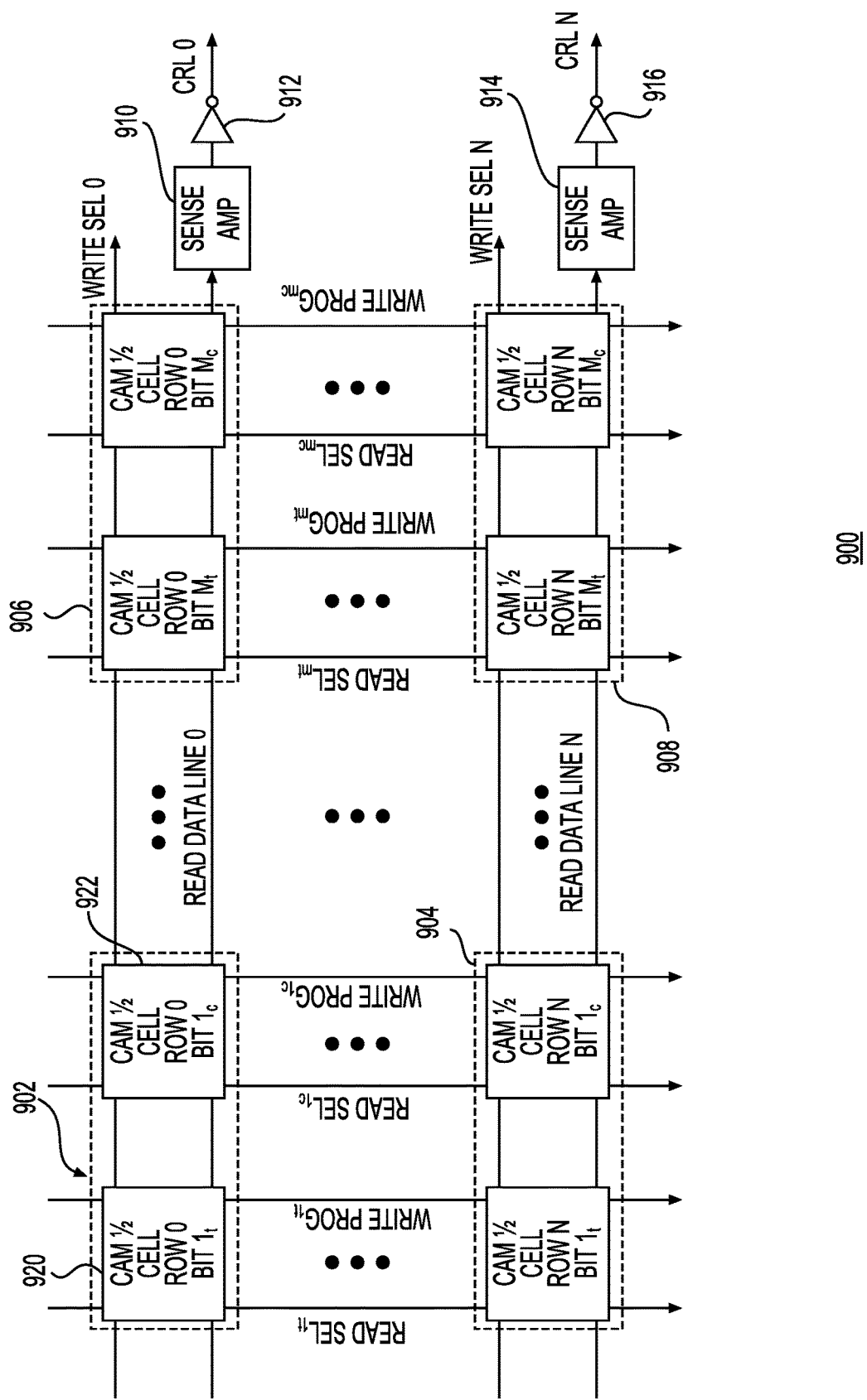
FIG. 9 shows one example organization of a CAM configured as a CAM directory.

FIG. 9 shows one example of CAM Directory Organization (CDO) 900 of CAM Directory 802 of FIG. 8. An array of CAM cells may be organized in N rows of M logical bits. In one example, each logical bit may require a true and complement cell to perform the comparator function. Each row, or CAM entry, represents a full comparison. In one example, if any logical bit does not compare, the wired-OR will be set high and it will be interpreted as a row miss. If all logical bits match, the wired-OR will remain low and it will be interpreted as a row hit. This organization of the CAM Directory may be suitable as a directory in a cache memory system where a row hit indicates an address match. The row hit signal can be used to drive directly the word line of JMRAM Data Cache 804 of FIG. 8. CDO 900 may include several memory elements in rows and columns. Thus, as an example, memory elements 902 and 906 may form READ DATA LINE 0 and memory elements 904 and 908 may form READ DATA LINE N. In addition, write selection lines, e.g., write sel 0 and write sel N lines, may run parallel to the READ DATA LINES. Memory elements 902 and 904 may form one column and memory elements 906 and 908 may form another column. In addition, read selection lines and write programming lines may form each of the columns. The output of each row may be coupled to a sense amplifier, e.g., sense amp 910 and 914. The output of each sense amplifier may be inverted before being used to activate the appropriate word line in JMRAM Data Cache 804 for the entry that matches the search bits. As an example, inverters 912 and 916 may be used to invert the output of the sense amplifiers. Each memory element may include two JMRAM cells (e.g., JMRAM cell 100, as described earlier with respect to FIG. 1). Thus, for example, memory element 902 may include two JMRAM cells 920 and 922, arranged as shown in FIG. 9. CDO 900 may be used to perform matching operations between input search bits and stored bits. In one example, from a logic point of view, each memory element 902 may perform an exclusive OR with respect to an input bit and a stored bit. Thus, as an example, if the input bit is A and the stored bit is B, in one example, memory element 902, in conjunction with inverter 912, is configured to perform a logical operation equivalent to $A\overline{B}+\overline{A}B$. Although FIG. 9 shows a certain number of components of CDO 900 arranged in a certain manner, there could be more or fewer components arranged differently.

In conclusion, a memory system comprising a content addressable memory having an array of content addressable memory elements including a plurality of rows of content addressable memory elements and a plurality of columns of content addressable memory elements is provided. Each of the content addressable memory elements may further include a first superconducting quantum interference device (SQUID) and a second superconducting quantum interference device (SQUID), where an input bit to each of the content addressable memory elements is compared with: (1) a first state of the first SQUID and (2) a second state of the second SQUID to generate an output signal. The memory system may also include a Josephson magnetic random access memory (JMRAM), coupled to the content addressable memory, which may include a plurality of word lines. The output signal may be configured to activate, without requiring decoding, one of the plurality of the word lines of the JMRAM. Each of the plurality of the word lines of the JMRAM is coupled via a connecting cell element to a corresponding one of the plurality of rows of the content addressable memory elements, and the connecting cell element is configured to provide a continuous conduction path for forwarding the output signal to a respective one of the plurality of the word lines of the JMRAM. The memory system may further include a plurality of write selection lines, and where during a write operation one of the plurality of the write selection lines is configured to provide current to a corresponding one of the plurality of the rows of the content addressable memory elements. The memory system may further include a plurality of write programming lines, where during the write operation each of the plurality of the write programming lines is configured to provide current to each one of a corresponding one of the plurality of columns of the content addressable memory elements. The memory system may further include a plurality of read selection lines, and where during a read operation one of the plurality of the read selection lines is configured to provide current to a corresponding one of the plurality of the columns of the content addressable memory elements. Each of the plurality of rows of the content addressable elements corresponds to stored bits of a respective content addressable memory entry, where a row hit for an input address relates to a match between each of the input bits of the input address and each of the stored bits of the respective content addressable memory entry. A row miss for the input address relates to a mismatch between any of the input bits of the input address and any of the stored bits of the respective content addressable memory entry.

In another aspect, a memory system including a content addressable memory and a Josephson magnetic random access memory (JMRAM) is provided. The content addressable memory may include an array of content addressable memory elements. Each of the content addressable elements may further include a first superconducting quantum interference device (SQUID) and a second superconducting quantum interference device (SQUID), where an input bit to each of the content addressable memory elements is compared with: (1) a first state of the first SQUID and (2) a second state of the second SQUID to generate an output signal. The JMRAM may be coupled to the content addressable memory and the JMRAM may include a plurality of word lines, where the output signal may be configured to activate, without requiring decoding, one of the plurality of the word lines. Each of the plurality of the word lines of the JMRAM is coupled via a connecting cell element to a corresponding one of a plurality of rows of content addressable memory elements, and the connecting cell element is configured to provide a continuous conduction path for forwarding the output signal to a respective one of the plurality of the word lines of the JMRAM. The memory system may further include a plurality of write selection lines, and where during a write operation one of the plurality of the write selection lines is configured to provide current to a corresponding one of a plurality of rows of content addressable memory elements. The memory system may further include a plurality of write programming lines, where during the write operation each of the plurality of the write programming lines is configured to provide current to each one of a corresponding one of a plurality of columns of content addressable memory elements. The memory system may further include a plurality of read selection lines, and where during a read operation one of the plurality of the read selection lines is configured to provide current to a corresponding one of the plurality of the columns of the content addressable memory elements. Each of a plurality of rows of content addressable elements corresponds to stored bits of a respective content addressable memory entry, where a row hit for an input address relates to a match between each of the input bits of the input address and each of the stored bits of the respective content addressable memory entry. A row miss for the input address relates to a mismatch between any of the input bits of the input address and any of the stored bits of the respective content addressable memory entry.

In yet another aspect, a memory system including a content addressable memory system and a Josephson magnetic random access memory (JMRAM) is provided. The content addressable memory may include a plurality of rows of content addressable memory elements and a plurality of columns of content addressable memory elements, where each of the plurality of rows of the content addressable elements may correspond to stored bits of a respective content addressable memory entry, where a row hit for an input address may relate to a match between each of the input bits of the input address and each of the stored bits of the respective content addressable memory entry, and where a row hit signal may be generated based on the row hit. The JMRAM may be coupled to the content addressable memory and the JMRAM may include a plurality of word lines, where the row hit signal may be configured to activate, without requiring decoding, one of the plurality of word lines. The memory system may further include a plurality of write selection lines, and where during a write operation one of the plurality of the write selection lines is configured to provide current to a corresponding one of the plurality of the rows of the content addressable memory elements. The memory system may further include a plurality of write programming lines, where during the write operation each of the plurality of the write programming lines is configured to provide current to each one of a corresponding one of the plurality of columns of the content addressable memory elements. The memory system may further include a plurality of read selection lines, and where during a read operation one of the plurality of the read selection lines is configured to provide current to a corresponding one of the plurality of the columns of the content addressable memory elements.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A memory system comprising:
   a memory having an array of memory elements, wherein each of the array of the memory elements further comprising:
      a first magnetic Josephson junction (MJJ); and
      a second magnetic Josephson junction (MJJ), wherein an input bit to each of the memory elements is compared with: (1) a first state of the first MJJ and (2) a second state of the second MJJ to generate an output signal.

2. The memory system of claim 1 further comprising a Josephson magnetic random access memory (JMRAM), coupled to the memory, comprising a plurality of word lines.

3. The memory system of claim 2, wherein the output signal is configured to activate, without requiring decoding, one of the plurality of the word lines of the JMRAM.

4. The memory system of claim 2, wherein the array of the memory elements further comprises a plurality of rows of memory elements, and wherein each of the plurality of the word lines of the JMRAM is coupled via a connecting cell element to a corresponding one of the plurality of rows of the memory elements, and wherein the connecting cell element is configured to provide a continuous conduction path for forwarding the output signal to a respective one of the plurality of the word lines of the JMRAM.

5. The memory system of claim 1, wherein the array of the memory elements further comprises a plurality of rows of memory elements, and the memory system further comprising a plurality of write selection lines, and wherein during a write operation one of the plurality of the write selection lines is configured to provide current to a corresponding one of the plurality of rows of the memory elements.

6. The memory system of claim 5, wherein the array of the memory elements further comprises a plurality of columns of memory elements, and the memory system further comprising a plurality of write programming lines, wherein during the write operation each of the plurality of the write programming lines is configured to provide current to each one of a corresponding one of the plurality of columns of the memory elements.

7. The memory system of claim 6 further comprising a plurality of read selection lines, and wherein during a read operation one of the plurality of the read selection lines is configured to provide current to a corresponding one of the plurality of the columns of the memory elements.

8. The memory system of claim 1, wherein the array of the memory elements further comprises a plurality of rows of memory elements, and wherein each of the plurality of rows of the memory elements corresponds to stored bits of a respective memory entry, wherein a row hit for an input address relates to a match between each of the input bits of the input address and each of the stored bits of the respective memory entry.

9. The memory system of claim 8, wherein a row miss for the input address relates to a mismatch between any of the input bits of the input address and any of the stored bits of the respective memory entry.

10. A method in a memory system comprising a first memory having an array of memory elements, wherein each of the array of the memory elements further comprising a first superconducting circuit comprising a first magnetic Josephson junction (MJJ) and a second superconducting circuit comprising a second magnetic Josephson junction (MJJ), the method comprising:
   comparing an input bit to a memory element with: (1) a first state of the first MJJ and (2) a second state of the second MJJ to generate an output signal.

11. The method of claim 10, wherein the memory system further comprising a second memory, coupled to the first memory, comprising a plurality of word lines.

12. The method of claim 11 further comprising in response to the output signal, activating one of the plurality of the word lines of the second memory.

13. The method of claim 11 further comprising in response to the output signal, activating, without requiring decoding, one of the plurality of the word lines of the second memory.

14. The method of claim 11, wherein the array of the memory elements further comprising a plurality of rows of memory elements, and wherein each of the plurality of the word lines of the second memory is coupled via a connecting cell element to a corresponding one of the plurality of rows of the memory elements, and the method further comprising the connecting cell element providing a continuous conduction path for forwarding the output signal to a respective one of the plurality of the word lines of the second memory.

15. The method of claim 11, wherein the array of the memory elements further comprising a plurality of rows of memory elements, and the memory system further comprising a plurality of write selection lines, and the method further comprising, during a write operation, one of the plurality of the write selection lines providing current to a corresponding one of the plurality of rows of the memory elements.

16. The method of claim 15, wherein the array of the memory elements further comprising a plurality of columns of memory elements, and the memory system further comprising a plurality of write programming lines, and the method further comprising, during the write operation, at least one of the plurality of the write programming lines providing current to a corresponding one of the plurality of columns of the memory elements.

17. The method of claim 16, wherein the memory system further comprising a plurality of read selection lines, and the method further comprising, during a read operation, one of the plurality of the read selection lines providing current to a corresponding one of the plurality of the columns of the memory elements.

18. A memory system comprising:
   a memory having an array of memory elements, wherein each of the array of the memory elements further comprising:
      a first superconducting circuit comprising a first magnetic Josephson junction (MJJ); and
      a second superconducting circuit comprising a second magnetic Josephson junction (MJJ), wherein an input bit to each of the memory elements is compared with: (1) a first state of the first MJJ and (2) a second state of the second MJJ to generate an output signal.

19. The memory system of claim 18 further comprising a Josephson magnetic random access memory (JMRAM), coupled to the memory, comprising a plurality of word lines.

20. The memory system of claim 19, wherein the output signal is configured to activate, without requiring decoding, one of the plurality of the word lines of the JMRAM.

\* \* \* \* \*